United States Patent
White et al.

(10) Patent No.: US 11,450,938 B2
(45) Date of Patent: Sep. 20, 2022

(54) HYBRID KINETIC INDUCTANCE DEVICES FOR SUPERCONDUCTING QUANTUM COMPUTING

(71) Applicant: Google LLC, Mountain View, CA (US)

(72) Inventors: Theodore Charles White, Mountain View, CA (US); Anthony Edward Megrant, Mountain View, CA (US)

(73) Assignee: Google LLC, Mountain View, CA (US)

( * ) Notice: Subject to any disclaimer, the term of this patent is extended or adjusted under 35 U.S.C. 154(b) by 678 days.

(21) Appl. No.: 16/462,263

(22) PCT Filed: Sep. 13, 2017

(86) PCT No.: PCT/US2017/051366
§ 371 (c)(1),
(2) Date: May 20, 2019

(87) PCT Pub. No.: WO2019/055002
PCT Pub. Date: Mar. 21, 2019

(65) Prior Publication Data
US 2019/0341668 A1 Nov. 7, 2019

(51) Int. Cl.
*G06N 10/00* (2022.01)
*H01L 39/24* (2006.01)
(Continued)

(52) U.S. Cl.
CPC .............. *H01P 7/086* (2013.01); *G06N 10/00* (2019.01); *H01L 27/18* (2013.01); *H01L 39/2416* (2013.01)

(58) Field of Classification Search
CPC ....... H01L 2223/6627; H01L 23/49827; H01L 23/49888; H01L 23/50; H01L 39/2416;
(Continued)

(56) References Cited

U.S. PATENT DOCUMENTS 8,954,125 B2 * 2/2015 Corcoles Gonzalez .................... H01L 39/2416 505/238
9,490,112 B2 * 11/2016 McDermott, III .... H01J 49/025
(Continued)

FOREIGN PATENT DOCUMENTS

FR 2906934 A1 * 4/2008 ............... G01J 1/02
JP 2004247540 9/2004
(Continued)

OTHER PUBLICATIONS

Aluminium-oxide wires for superconducting high kinetic inductance circuits. H Rotzinger et al. (Year: 2017).*
(Continued)

*Primary Examiner* — Vibol Tan
(74) *Attorney, Agent, or Firm* — Fish & Richardson P.C.

(57) ABSTRACT

A device includes: a substrate; a first superconductor layer on the substrate, the first superconductor layer having a first kinetic inductance; and a second superconductor layer on the first superconductor layer, the second superconductor layer having a second kinetic inductance that is lower than the first kinetic inductance, in which the second superconductor layer covers the first superconductor layer such that the second superconductor layer and the first superconductor layer have a same footprint, with the exception of at least a first region where the second superconductor layer is omitted so that the first superconductor layer and the second superconductor layer form a circuit element having a predetermined circuit parameter.

34 Claims, 5 Drawing Sheets

(51) Int. Cl.
*H01P 7/08* (2006.01)
*H01L 27/18* (2006.01)

(58) Field of Classification Search
CPC . H01P 7/00; H01P 7/086; H01P 7/088; G06N 10/00; B82Y 10/00
See application file for complete search history.

(56) References Cited

U.S. PATENT DOCUMENTS

| | | | |
|---|---|---|---|
| 10,989,604 B1 * | 4/2021 | Denis | G01J 5/20 |
| 2014/0113828 A1 | 4/2014 | Gilbert et al. | |
| 2016/0018267 A1 | 1/2016 | Timofeev et al. | |

FOREIGN PATENT DOCUMENTS

| | | |
|---|---|---|
| JP | 2007525032 | 8/2007 |
| WO | WO 2018/144601 | 8/2018 |
| WO | WO 2019/032115 | 2/2019 |

OTHER PUBLICATIONS

An Introduction to Kinetic Inductance Detectors. (No names) (Year: 2012).*
Kinetic Inductance in Superconducting Microstructures. K. V. Shein et al. (Year: 2020).*
Office Action in Japanese Appln. No. 2020-514991, dated Aug. 2, 2021, 4 pages (with English translation).
AU Notice of Acceptance in Australian Appln. No. 2017432161, dated Nov. 25, 2020, 3 pages.
PCT International Preliminary Report on Patentability in International Appln. No. PCT/US2017/051366, dated Mar. 26, 2020, 7 pages.
CA Office Action in Canadian Appln. No. 3,074,722, dated May 25, 2021, 6 pages.
Gladchenko et al., "Superposition of Inductive and Capacitive Coupling in Superconducting LC Resonators," IEEE Transactions on Applied Superconductivity, Jun. 2011, 21(3):875-878.
Dominjon et al., "Study of Superconducting Bilayer for Microwave Kinetic Inductance Detectors for Astrophysics", IEEE transactions on applied superconductivity, Apr. 2016, 26(3): 1-6.
Goppl et al., "Coplanar Waveguide Resonators for Circuit Quantum Electrodynamics," Journal of Applied Physics, Jan. 2008, 104(11): 113904.
PCT International Search Report and Written Opinion in International Appln. No. PCT/US2017/051366, dated Jun. 4, 2018, 13 pages.
Tuckerman et al., "Flexible superconducting Nb transmission lines on thin film polyimide for quantum computing applications", Superconductor Science and Technology, Jul. 2016, 29(8): 84007.
Vissers et al., "Frequency-tunable superconducting resonators via nonlinear kinetic inductance," Applied Physics Letters, Aug. 2015, 107(6): 1-10.
Watanabe et al., "Kinetic Inductance of Superconducting Coplanar Waveguides," Jpn. J. Appl. Phys, Oct. 1994, 33(10): 5708-5712.
Zmuidzinas, "Superconducting Microresonators: Physics and Applications", Annual Review of Condensed Matter Phy, Mar. 2012, 3: 169-214.
AU Office Action in Australian Appln. No. 2017432161, dated Aug. 31, 2020, 3 pages.
Office Action in Australian Appln. No. 2021201519, dated Mar. 9, 2022, 5 pages.
EP Communication pursuant to Article 94(3) EPC in European Appln. No. 17772560.3, dated Jan. 28, 2020, 4 pages.
Decision to Grant Patent in Japanese Appln. No. 2020-514991, dated Jan. 31, 2022, 5 pages (with English translation).
Notice of Acceptance for Patent Application in Australia Appln. No. 2021201519, dated Jun. 23, 2022, 3 pages.

* cited by examiner

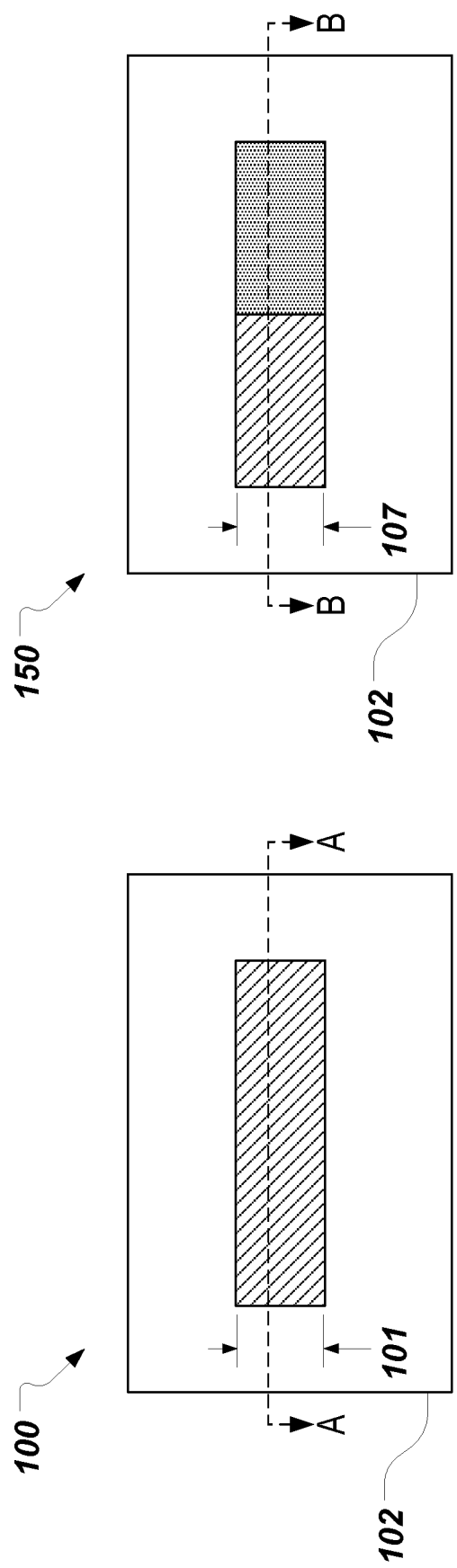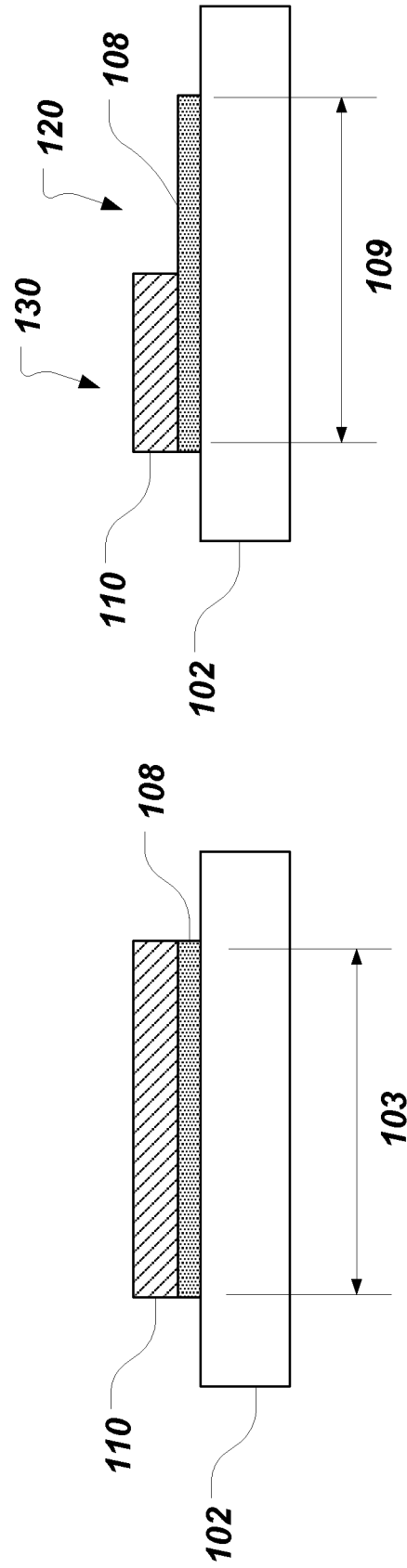
FIG. 1A
FIG. 1B

HYBRID KINETIC INDUCTANCE DEVICES FOR SUPERCONDUCTING QUANTUM COMPUTING

CROSS-REFERENCE TO RELATED APPLICATION

This application is a National Stage Application under 35 U.S.C. § 371 and claims the benefit of International Application No. PCT/US2017/051366, filed Sep. 13, 2017. The disclosure of the foregoing application is hereby incorporated by reference in its entirety.

TECHNICAL FIELD

The present disclosure relates to hybrid kinetic inductance devices for quantum information processing systems.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure can be embodied in devices including: a substrate; a first superconductor layer on the substrate, the first superconductor layer having a first kinetic inductance; and a second superconductor layer on the first superconductor layer, the second superconductor layer having a second kinetic inductance that is lower than the first kinetic inductance, in which the second superconductor layer covers the first superconductor layer such that the second superconductor layer and the first superconductor layer have a same footprint, with the exception of at least a first region where the second superconductor layer is omitted so that the first superconductor layer and the second superconductor layer form a circuit element having a predetermined circuit parameter.

Implementations of the devices may include one or more of the following features. For example, in some implementations, the second superconductor layer provides a lower impedance current path relative to the first superconductor layer.

In some implementations, more than 50% of an overall inductance of the first superconductor layer is attributed to the first kinetic inductance. In some implementations, more than 90% of the overall inductance of the first superconductor layer is attributed to the first kinetic inductance. In some implementations, less than 50% of the overall inductance of the second superconductor layer is attributed to the second kinetic inductance.

In some implementations, the predetermined circuit parameter has a resonant frequency.

In some implementations, the predetermined circuit parameter is a center frequency or a cut-off frequency of the circuit element.

In some implementations, the predetermined circuit parameter is a characteristic impedance of the circuit element.

In some implementations, the circuit element includes a qubit measurement resonator.

In some implementations, the circuit element includes a co-planar waveguide.

In some implementations, the circuit element includes a frequency filter. The frequency filter may be a bandpass filter.

In some implementations, the first superconductor layer is titanium nitride.

In some implementations, the first superconductor layer is niobium nitride.

In some implementations, the first superconductor layer is a superconductor ceramic. In some implementations, the second superconductor layer is aluminum.

In general, in another aspect, the subject matter of the present disclosure can be embodied in systems that include: a first superconductor trace comprising having a first predetermined resonator frequency; a second superconductor trace having a second predetermined resonator frequency that is different than the first predetermined resonator frequency, in which each of the first superconductor trace and the second superconductor trace includes a first layer of a first superconductor material and a second layer of a second superconductor material on the first layer, and in which a footprint of the first superconductor trace is the same as a footprint of the second superconductor trace.

Implementations of the systems may have one or more of the following features. For example, in some implementations, the first superconductor material has a first kinetic inductance, and the second superconductor material has a second kinetic inductance that is lower than the first kinetic inductance. For the first superconductor trace, a footprint of the second superconductor layer may match a footprint of the first superconductor layer with the exception of at least a first region where the second superconductor layer is omitted such that the first superconductor trace has the first predetermined resonator frequency. For the second superconductor trace, a footprint of the second superconductor layer may match a footprint of the first superconductor layer with the exception of at least a second region where the second superconductor layer is omitted such that the second superconductor trace has the second predetermined resonator frequency. The first superconductor trace may be a first qubit measurement resonator, and the second superconductor trace may be a second qubit measurement resonator. The first superconductor trace may be a first frequency filter and the first predetermined resonator frequency may be a cut-off or center frequency of the first frequency filter, and the second superconductor trace may be a second frequency filter and the second predetermined resonator frequency may be a cut-off or center frequency of the second frequency filter.

In general, in some other aspects, the subject matter of the present disclosure may be embodied in superconductor strip lines that include: a dielectric layer; a superconductor trace embedded in the dielectric layer, in which the superconductor trace includes a first superconductor material having a first kinetic inductance; and a via contact within the dielectric layer and extending to the first superconductor trace, in which the via contact includes a second superconductor material having a second kinetic inductance that is lower than the first kinetic inductance. In some implementations, more than 50% of an overall inductance of the first superconductor material is attributed to the first kinetic inductance. In some implementations, more than 90% of the overall inductance of the first superconductor material is attributed to the first kinetic inductance. In some implementations, less than 50% of the overall inductance of the second superconductor material is attributed to the second kinetic inductance.

In some implementations, an inductance per unit length of the first superconductor material is higher than an inductance per unit length of the second superconductor material.

In general, in other aspects, the subject matter of the present disclosure can be embodied in devices that include: a substrate; and a circuit element including a superconductor trace on the substrate, in which more than 50% of an overall inductance of the superconductor trace is attributed to a kinetic inductance of a superconducting material forming the superconductor trace, a first region of the superconductor trace has a first cross-sectional area exhibiting a first kinetic inductance, and a second region of the superconductor trace has a second cross-sectional area exhibiting a second kinetic inductance, the first cross-sectional area being different from the second cross-sectional area such that the first kinetic inductance is different than the second kinetic inductance and such that the circuit element has a predetermined circuit parameter.

Implementations of the devices may have one or more of the following features. For example, in some implementations, the predetermined circuit parameter is a resonant frequency. In some implementations, the superconductor material includes titanium nitride, niobium nitride or a superconductor ceramic.

In some implementations, the circuit element includes a qubit measurement resonator.

In some implementations, the circuit element includes a frequency filter.

In some implementations, more than 90% of the overall inductance of the superconductor trace is attributed to the kinetic inductance of the superconductor material.

In some implementations, the superconductor trace consists of the superconductor material.

Particular implementations of the subject matter described here can realize one or more of the following advantages. For example, in some implementations, it is possible to fabricate circuit elements of the same type (e.g., qubit, qubit measurement resonator, co-planar waveguide, and signal trace, among other circuit element types) having different predetermined resonance properties without substantially different geometric dimensions. By forming circuit elements, at least in part, from high kinetic inductance materials, it is possible in some implementations to reduce the design complexity of quantum information processing systems. In particular, circuit elements of the same type may be formed to have different resonance properties, without requiring different sizes or the use of different materials among each of the various circuit elements. Moreover, fabricating circuit elements to have the same size but different resonance properties can, in some implementations, free up space and allow for an increase in the density of the circuit elements within a quantum information processing system. Furthermore, in some implementations, forming a circuit element, at least in part, from high kinetic inductance materials allows the circuit element to have predetermined resonance properties in a more compact geometry relative to the same circuit element fabricated without high kinetic inductance material.

The details of one or more implementations are set forth in the accompanying drawings and the description below. Other features and advantages will be apparent from the description, the drawings, and the claims.

BRIEF DESCRIPTION OF THE DRAWINGS

FIG. 1A is a schematic illustrating a plan-view and a cross-section view (at line A-A) of an example of a first circuit element.

FIG. 1B is a schematic illustrating a plan-view and a cross-section view (at line B-B) of an example of a second circuit element.

DETAILED DESCRIPTION

Figure 2:
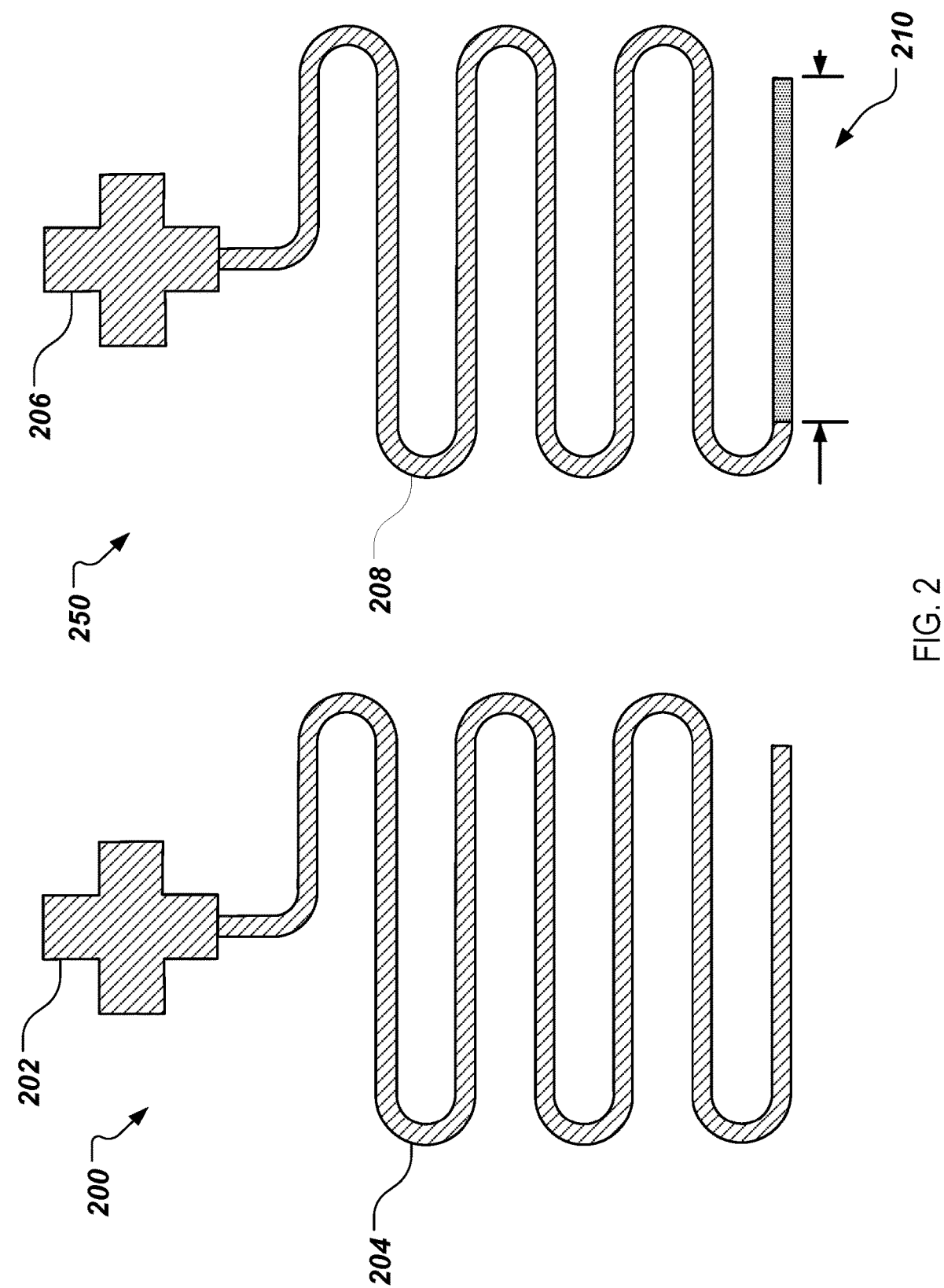
FIG. 2 is a schematic illustrating a plan view of an example of a system that includes qubits and measurement resonators fabricated, at least in part, from a high kinetic conductance material.

Quantum computing entails coherently processing quantum information stored in the quantum bits (qubits) of a quantum information processing system. As the number of qubits within a quantum information processing system increases, the computational capabilities of the system increases substantially, potentially providing processing power far exceeding that of classical computing systems for certain complex problems.

Superconducting quantum information processing systems may include circuit elements that are formed using superconducting materials and that are principally controlled through the application of microwave signals in the range of several hundred MHz to several hundred GHz, such as between 500 MHz-20 GHz. In some implementations, the circuit elements of a superconducting quantum information processing system, such as the qubits, may exhibit "resonance" conditions in which the microwave control signals are used to drive transitions between different states (e.g., the different states of a qubit). Additionally, microwaves may be used to measure the state of a qubit through a measurement resonator coupled to the qubit. The resonance conditions and resonance frequencies associated with such circuit elements of a superconducting quantum information processing system are related to the overall inductance associated with the circuit elements. Thus, one way to modify the resonance condition and/or resonance frequency is to change the overall inductance of the circuit element by altering the geometry of the circuit element.

Alternatively, as disclosed herein, the overall inductance, and thus the resonance properties, of circuit elements may be modified by forming the circuit elements, at least in part, from materials exhibiting high kinetic inductance, $L_K$. Kinetic inductance is the manifestation of the inertial mass of mobile charge carriers in alternating electric fields as an equivalent series inductance. Kinetic inductance may be observed at very high frequencies (e.g., in the microwave frequency range) in high carrier mobility conductors and superconductors. Kinetic inductance contrasts with geometric magnetic inductance in a superconductor, $L_M$, which relates to the energy stored due to the magnetic field induced by the applied current, and which depends on the geometry of the conductor. Geometric inductance therefore is material independent, whereas kinetic inductance is material dependent. For the general case of the superconducting strip of width W and thickness t, the kinetic inductance per unit length $L_K$ may be expressed as $$L_K = \frac{\mu_0 \lambda_L^2}{Wt},$$

where $\mu_0$ is the vacuum permeability and $\lambda_L$ is the London penetration depth. Similarly, for a superconducting coplanar, waveguide resonator, the kinetic inductance may be expressed as $$L_K = \frac{\mu_0 \lambda_L^2}{Wt} g,$$

where g is a function of the center trace width W, the center trace thickness t, and the spacing width s between the center trace and the ground planes. Since the inductance depends on both width and length of a trace, the kinetic inductance also may be expressed as an inductance per square. For a superconducting material, the total inductance per unit length may be expressed as $L=L_M+L_K$. For certain superconductors, the value of geometric magnetic inductance is negligible compared to the kinetic inductance such that $L \approx L_K$. Accordingly, for the example of a co-planar waveguide, the overall inductance of the waveguide may be attributed to a geometric inductance per unit length which comes from the width to gap ratio of the co-planar waveguide, and to a kinetic inductance per square, which varies according to the material used for the waveguide and is independent of the geometric inductance (but also depends on the waveguide geometry).

While the kinetic inductance of a superconductor material also may vary with temperature, the kinetic inductances referred to herein correspond to the values exhibited in an environment that is at or below the critical temperature of the superconductors with which the kinetic inductance is associated, and are generally constant in such temperature regimes.

By using materials exhibiting high kinetic inductance at the frequencies (e.g., between 500 MHz-20 GHz) typically applied in superconducting quantum information processing systems, it is possible, in some implementations, to fabricate circuit elements of the same type (e.g., qubit, qubit measurement resonator, co-planar waveguide, and signal trace, among other circuit element types) having different predetermined resonance properties without substantially different geometric dimensions. For example, a superconducting circuit element may be formed to have a first set of geometric dimensions (e.g., length and width) and a first predetermined resonance frequency, while a second superconducting circuit element may be formed to have the same geometric dimensions (e.g., length and width) as the first qubit measurement resonator but a different predetermined resonance frequency by altering the amount of high kinetic inductance material that contributes to the overall inductance of the second superconducting circuit element.

By forming circuit elements, at least in part, from high kinetic inductance materials, it is possible in some implementations to reduce the design complexity of quantum information processing systems. In particular, circuit elements of the same type may be formed to have different resonance properties, without requiring different sizes or the use of different materials among each of the various circuit elements. Moreover, fabricating circuit elements to have the same size but different resonance properties can, in some implementations, free up space and allow for an increase in the density of the circuit elements within a quantum information processing system. Furthermore, in some implementations, forming a circuit element, at least in part, from high kinetic inductance materials allows the circuit element to have predetermined resonance properties in a more compact geometry relative to the same circuit element fabricated without high kinetic inductance material.

FIG. 1A is a schematic illustrating a plan-view and a cross-section view (at line A-A) of an example of a first circuit element 100, and FIG. 1B is a schematic illustrating a plan-view and a cross-section view (at line B-B) of an example of a second circuit element 150. Each of the first circuit element 100 and the second circuit element 150 may be, e.g., a thin-film signal trace. Signal traces may be used in quantum information processing devices to transmit signals to and from control and data circuit elements. For instance, in some implementations, a signal trace forms part of a co-planar waveguide, such as the center trace that is laterally bounded on either side by an air gap and a ground plane. Such a co-planar waveguide may be coupled to a qubit to provide the qubit with one or more control signals for causing a transition between different qubit states. In some implementations, a signal trace forms part of a qubit measurement resonator for reading out the state of a qubit. In some implementations, a signal trace forms part of a qubit coupling element for inductively or capacitively coupling two or more qubits or other circuit elements together. In some implementations, a signal trace is part of a stripline configuration rather than part of a co-planar waveguide. That is, the signal trace is embedded in a dielectric substrate bounded on the top and bottom by a ground plane.

Each of the first circuit element 100 and the second circuit element 150 is formed on a dielectric substrate 102, such as a silicon or sapphire wafer. The first circuit element 100 has a width 101 and a length 103, whereas the second circuit element 150 has a width 107 and a length 109. A footprint of the first circuit element 100 corresponds to the area of the substrate surface defined by the width 101 and length 103. A footprint of the second circuit element 150 corresponds to the area of the substrate surface defined by the width 107 and length 109.

Furthermore, as shown in the cross-sections of FIGS. 1A-1B, each of the first circuit element 100 and the second circuit element 150 includes a bi-layer of material. That is, each of the first circuit element 100 and the second circuit element 150 includes a first layer 108 on the substrate 102 and a second layer 110 on the first layer 108. In the first circuit element 100, the second layer 110 completely covers the upper surface of the first layer 108. In the second circuit element 150, a first portion or region 120 is devoid of the second layer 110 to reveal/expose the upper surface of the first layer 108. In a second portion or region 130 of the circuit element 150, the second layer 110 covers the upper surface of the first layer 108.

The first layer 108 is formed from a material having a high kinetic inductance relative to the kinetic inductance of the material that forms the second layer 110. For example, the first layer 108 may be formed from a material that exhibits a high kinetic inductance, including superconductors and/or ceramics such as, e.g., titanium nitride, niobium titanium nitride, niobium nitride, tungsten silicide, platinum silicide, and superconducting aluminum oxide. The second layer 110 may be formed from a material that exhibits no or much less kinetic inductance than the material of the first layer 108 including materials such as, e.g., aluminum, indium, molybdenum and ruthenium. While kinetic inductance can vary with frequency, in superconducting systems in the 50 MHz to 20 GHz range, kinetic inductance, for a fixed element size, is a constant of the material depending on the London penetration depth. As explained herein, superconducting quantum information processing systems entail the application of signals in the microwave frequency range such as, e.g., between 300 MHz and 300 GHz, including between 500 MHz and 20 GHz. Thus, for the examples set forth herein, a superconducting material is understood to have a "high" or a "low" kinetic inductance value for applied electromagnetic fields within the microwave frequency range (e.g., between 500 MHz and 20 GHz) and at temperatures at or below the critical temperature of the superconducting material.

In some implementations, the first layer 108 may be formed from a material having a first kinetic inductance, whereas the second layer 110 may be formed from a material having a second different kinetic inductance. In some implementations, an overall inductance of the first layer 108 is attributed to both the first kinetic inductance $L_{K1}$ and to the geometric magnetic inductance $L_M$. For example, in some implementations, more than 50% of an overall inductance L of the first layer 108 is attributed to the first kinetic inductance $L_{K1}$, more than 60% of an overall inductance L of the first layer 108 is attributed to the first kinetic inductance $L_{K1}$, more than 70% of an overall inductance L of the first layer 108 is attributed to the first kinetic inductance $L_{K1}$, more than 80% of an overall inductance L of the first layer 108 is attributed to the first kinetic inductance $L_{K1}$, or more than 90% of an overall inductance L of the first layer 108 is attributed to the first kinetic inductance $L_{K1}$.

Similarly, in some implementations, the overall inductance of the second layer 110 is attributed both to the second kinetic inductance $L_{K2}$ and to the geometric magnetic inductance resulting from the second layer's shape, independent of material. For example, in some implementations, less than 50% of the overall inductance L of the second layer 110 is attributed to the second kinetic inductance $L_{K2}$, less than 40% of the overall inductance L of the second layer 110 is attributed to the second kinetic inductance $L_{K2}$, less than 30% of the overall inductance L of the second layer 110 is attributed to the second kinetic inductance $L_{K2}$, less than 20% of the overall inductance L of the second layer 110 is attributed to the second kinetic inductance $L_{K2}$, or less than 10% of the overall inductance L of the second layer 110 is attributed to the second kinetic inductance $L_{K2}$.

When a time-varying electric or magnetic field is applied to each of the first circuit element 100 and the second circuit element 150, a current may be generated in each of the first circuit element 100 and in the second circuit element 150. The second layer 110 provides a provides a lower impedance current path relative to the first layer 108 so that electric current travels primarily through the second layer 110 (negligible levels of current may travel through the first layer 108). That is, current travels primarily through the material exhibiting a zero or low kinetic inductance relative to the material exhibiting high kinetic inductance. The second layer 110 effectively acts as a short circuit around the first layer 108. Since the second layer 110 has zero or a relatively low kinetic inductance (e.g., less than 50% of the overall inductance attributed to kinetic inductance), the overall inductance of the first circuit element 100 may be determined primarily by the inductance resulting from the second layer's geometric inductance (derived from the magnetic permeability and shape) of the material forming the second layer 110.

In contrast, as explained herein, in the second circuit element 150, a first portion or region 120 is devoid of the second layer 110 to reveal/expose the upper surface of the first layer 108. In a second portion or region 130 of the circuit element 150, the second layer 110 covers the upper surface of the first layer 108. Again, the second layer 110 provides a lower impedance current path relative to the first layer 108. Accordingly, upon the application of a time-varying electric or magnetic field having a frequency in the microwave frequency range to the second circuit element 150, the current primarily travels through the second layer 110 in the second region 130 and travels through the first layer 108 in the first region 120. That is, the current primarily travels through the material exhibiting zero or low kinetic inductance in region 130, and travels through the material exhibiting high kinetic inductance in region 120. The second layer 110 effectively acts a short circuit around the first layer 108 in region 130. Thus, the overall inductance of the second circuit element 150 is determined by the inductance and shape (e.g., length, width and height) of the second layer 110 in the region 130, and by the kinetic inductance of the first layer 108 in the region 120.

As explained herein, in some implementations, the overall inductance of the first layer 108 may be substantially due to its kinetic inductance value rather than the inductance due to the material's magnetic permeability. For instance, more than 90% of the overall inductance of the first layer 108 may be attributed to its kinetic inductance.

Because the kinetic inductance of the first layer 108 is high relative to the geometric inductance of that layer, the kinetic inductance significantly increases the overall inductance of the circuit element. As a result, the second circuit element may be formed to have the same length 109 and width 107 of the second circuit element 150 can be made equal to the length 103 and width 101, respectively, of the first circuit element 100, using the same materials (e.g., aluminum and titanium nitride), but result in the first circuit element exhibiting a different overall inductance, and thus different resonant properties such as resonant frequency, from the overall inductance of the second circuit element 150. That is, the first circuit element 100 and the second circuit element 150 may have the same footprint on the substrate surface, using the same materials, but have different predetermined circuit parameters (e.g., different overall inductance and resonant properties or different characteristic impedance). It follows that by altering the amount of the first layer (which exhibits a high kinetic inductance) that is exposed or uncovered by the second layer (which exhibits a low or zero kinetic inductance), it is possible to alter circuit parameters (e.g., overall inductance and resonant properties) of a circuit element without altering the footprint of the circuit element on the substrate surface.

As explained with respect to FIG. 1, the circuit elements 100, 150 may form part of a qubit measurement resonator for reading out the state of a qubit. FIG. 2 is a schematic illustrating a plan view of an example of a system that includes qubits and measurement resonators fabricated, at least in part, from a high kinetic conductance material. In particular, FIG. 2 illustrates an example of a first qubit-measurement resonator pair 200 and a second adjacent qubit-measurement resonator pair 250. The first qubit-measurement resonator pair 200 includes a qubit 202 and a measurement resonator 204 coupled (e.g., through a direct electrical connection, a capacitive coupling, or an inductive coupling) to the qubit 202. The second qubit-measurement resonator pair 250 includes a qubit 206 and a measurement resonator 208 coupled (e.g., through a direct electrical connection, a capacitive coupling, or an inductive coupling) to an end of the qubit 206. Each of the qubit 202 and the qubit 206 may include a superconducting qubit, such as a phase qubit, a charge qubit, or a flux qubit (e.g., a co-planar waveguide flux qubit). Furthermore, each of the measurement resonator 204 and 208 is a co-planar waveguide. For ease of viewing, the ground plane is omitted and only the center conductors of the co-planar waveguides are shown in FIG. 2. Each of the measurement resonator 204 and 208 is formed, at least in part, from a thin film bi-layer. That is, each measurement resonator 204, 208 includes a first layer of superconductor material having a first kinetic inductance, and a second layer of superconductor material on the first layer of superconductor material, in which the second layer of superconductor material has a second kinetic inductance. The first kinetic inductance is higher than the second kinetic inductance in the microwave frequency range (e.g., between 500 MHz and 20 GHz). For example, the first layer of each measurement resonator may include titanium nitride, niobium nitride or superconducting aluminum oxide, whereas the second layer may include aluminum. The thickness of the first layer of superconductor material in each measurement resonator 204 and 208 may be the same. Similarly, the thickness of the second superconductor layer, where the second layer is provided, in each measurement resonator 204 and 208 may be the same. For instance, the thickness of the first layer of superconductor material in each resonator may be between several nanometers to approximately 100 nanometers, whereas the thickness of the second layer of superconductor material in each resonator may be between approximately ten nanometers and approximately several microns. Thus, the first measurement resonator 204 and the second measurement resonator 208 are formed from a bi-layer similar to that shown in FIG. 1 for the signal trace. The devices shown in FIG. 2 are fabricated on a dielectric substrate, such as silicon or sapphire.

Each of the first measurement resonator 204 and the second measurement resonator 208 has the same center conductor length 1, corresponding to a path length between an end of the center conductor proximal to the qubit to which the resonator is coupled and an end of the center conductor that is distal from the qubit to which the resonator is coupled. Each of the first measurement resonator 204 and the second measurement resonator 208 also has the same center conductor linewidth w. Furthermore, a gap width between the center conductors and adjacent ground planes is the same. Accordingly, both the first measurement resonator 204 and the second measurement resonator 208 have the same footprint.

As shown in FIG. 2, a difference between the first measurement resonator 204 and the second measurement resonator 208 is that the second measurement resonator 208 includes a region 210 of the central conductor having a length s, in which the second superconductor layer is absent or has been removed to expose/reveal the first superconductor layer. For the first measurement resonator 204, when a time-varying electric field having a predetermined frequency is applied (e.g., in the microwave frequency range), current will travel primarily through the second superconductor layer due to the second superconductor layer's lower overall impedance relative to the first superconductor layer. Thus, the first measurement resonator 204 will exhibit a fundamental resonator frequency $f_{o1}$ that is based on the inductance $L_2$ of the second superconductor layer. For example, for a quarter wave qubit readout resonator, the resonator frequency $f_{o1}$ may be expressed as $f_{o1}=1/(4s\sqrt{L_2C})$, where C is the capacitance per unit length. For a bandpass filter, $f_{o1}$ may be expressed as $f_{o1}=1/(2s\sqrt{L_2C})$.

In contrast, for the second measurement resonator 208, when a time-varying electric field having the predetermined frequency (e.g., in the microwave frequency range) is applied, current will travel primarily through the second superconductor layer only through the portion of the central conductor that includes the second superconductor layer. For the portion 210 of the central conductor where the second superconductor layer is absent or removed, current travels through the first superconductor layer. The second measurement resonator 208 thus exhibits an overall inductance based on the inductance $L_2$ of the second superconductor layer where the second superconductor layer is present, and based on the inductance $L_1$ of the first superconductor layer where the second superconductor layer is absent. The inductance $L_2$ of the second superconductor layer for resonator 208 may be primarily attributed to its geometric inductance. The inductance $L_1$ of the first superconductor layer for resonator 208 may be expressed as a function of the first superconductor layer's kinetic inductance and geometric inductance attributable to the shape of the first superconductor layer in the region in which the second superconductor layer is absent. For example, more than 50%, more than 60%, more than 70%, more than 80%, or more than 90% of the inductance of the first superconductor layer may be attributed to the kinetic inductance of the material forming the first superconductor layer. Because of the portion 210 exposing the high kinetic inductance material, the overall inductance of the second measurement resonator will be higher than the overall inductance of the first measurement resonator. Furthermore, the fundamental resonator frequency $f_{o2}$ of resonator 208 may be expressed as a function of $(L_1+L_2)$. For example, for a quarter wave qubit readout resonator, the resonator frequency $f_{o1}$ may be expressed as $f_{o2}=\frac{1}{4}s\sqrt{(L_1+L_2)C}$, where s is the trace length and C is the capacitance per unit length. For a bandpass filter, the frequency would be half of the quarter wave qubit readout resonator frequency. The system shown in FIG. 2 therefore includes two qubit measurement resonators each having the same footprint on the substrate, but different fundamental operating frequencies, allowing simplification and uniform design of a quantum information processing system.

Though FIG. 2 shows examples of qubit measurement resonators, the subject matter of the present disclosure may be applied to other types of resonators as well. For example, in some implementations, multiple bandpass filters may be formed, in which each bandpass resonator includes a thin film bi-layer having the same overall footprint on a substrate, but where the coverage of a second superconductor layer exhibiting a low kinetic inductance over a first superconductor layer exhibiting a high kinetic inductance differs among the bandpass resonators. A readout resonator has one end of the resonator shorted to ground and an opposite end open, whereas a bandpass filter has both ends of the resonator open. By altering the coverage of the second superconductor layer having the low kinetic inductance, the bandpass resonators may exhibit different center frequencies.

Similarly, in some implementations, multiple low pass filters may be formed, in which each low pass filter includes a thin film bi-layer having the same overall footprint on a substrate, but where the coverage of a second superconductor layer exhibiting a low kinetic inductance over a first superconductor layer exhibiting a high kinetic inductance differs among the low pass filters. By altering the coverage of the second superconductor layer having the low kinetic inductance, the low pass filters resonators may exhibit different cutoff frequencies.

Similarly, in some implementations, multiple high pass filters may be formed, in which each high pass filter includes a thin film bi-layer having the same overall footprint on a substrate, but where the coverage of a second superconductor layer exhibiting a low kinetic inductance over a first superconductor layer exhibiting a high kinetic inductance differs among the high pass filters. By altering the coverage of the second superconductor layer having the low kinetic inductance, the high pass filters resonators may exhibit different cutoff frequencies.

Figure 3B:
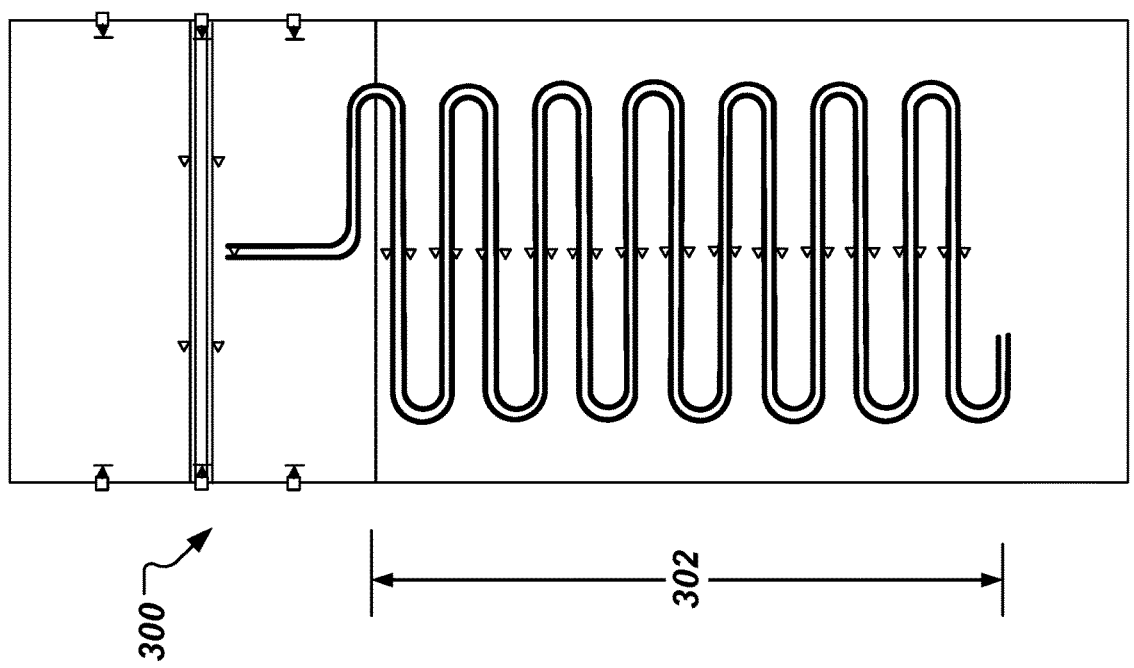
FIGS. 3A and 3B are schematics illustrating plan-views of an example of a first superconductor measurement resonator and an example of a second superconductor measurement resonator, respectively.
Figure 3A:
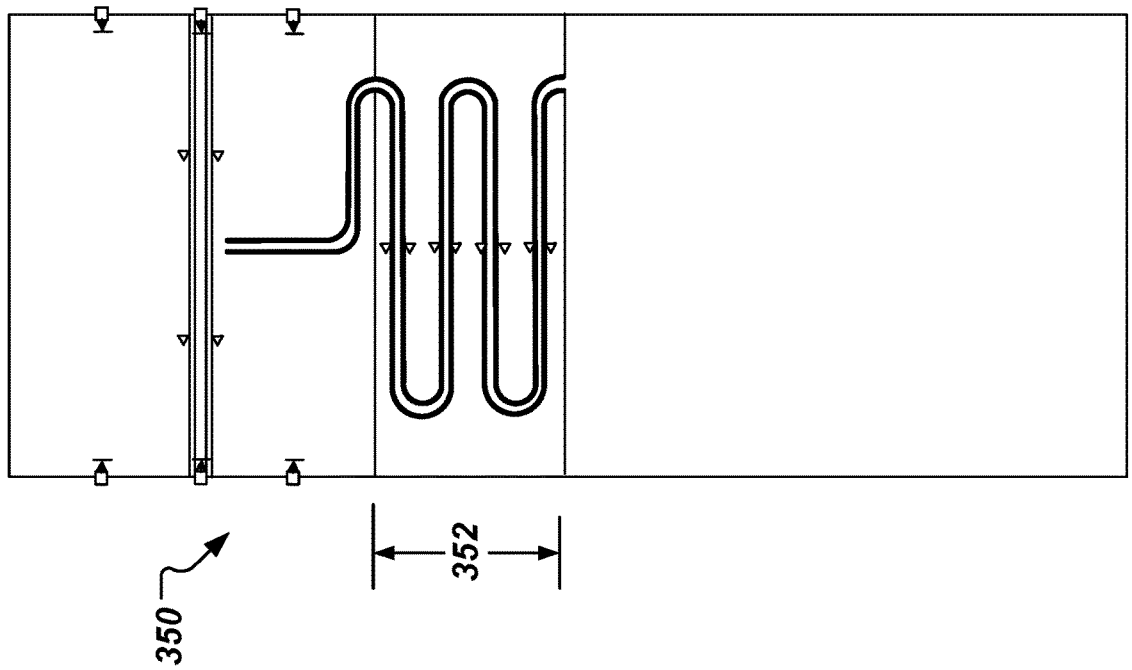

The use of superconductor materials having high kinetic inductance also allows forming more compact circuit elements that exhibit the same inductance, and thus the same resonance properties, as larger circuit elements formed from materials having lower kinetic inductance. FIGS. 3A and 3B are schematics illustrating plan-views of a first superconductor measurement resonator 300 and a second superconductor measurement resonator 350, respectively. As with the measurement resonators of FIG. 2, each of the first and second measurement resonators 300, 350 includes a center conductor laterally separated from a ground plane by a constant gap width. For ease of viewing, the ground planes are omitted from FIGS. 3A and 3B. In contrast to the resonators of FIG. 2, however, the first measurement resonator 300 and the second measurement resonator 350 are not formed from bilayer films having both low kinetic inductance and high kinetic inductance materials. Rather, the first measurement resonator 300 is formed entirely from a thin film (e.g., approximately several nm to approximately 2 microns) of superconductor material having a low kinetic inductance at a predetermined frequency (e.g., between 500 MHz-20 GHz) of an applied electric field, such as aluminum. The second measurement resonator 350 is formed entirely from a thin film (e.g., approximately several nm to approximately-2 microns) of superconductor material having a high kinetic inductance (e.g., a kinetic inductance ratio of 9:1 compared to the kinetic inductance of the material forming resonator 300) at the predetermined frequency, such as titanium nitride or niobium nitride. As shown in FIGS. 3A and 3B, the first measurement resonator 300 has a much longer center trace length than the second measurement resonator 350. Due to the higher kinetic inductance of the material constituting resonator 350 relative to the kinetic inductance of the material constituting resonator 300, the resonator 350 may be formed to provide the same overall inductance as resonator 300, but with a much shorter center trace length. In some implementations, forming a quantum information processing device, such as a qubit measurement resonator, entirely out of a high kinetic inductance material may unintentionally distort low frequency waveforms (e.g., between 0 and about 300 MHz) applied to the device, whereas quantum information processing devices formed from both high and low kinetic inductance materials (e.g., both superconductors) may induce less waveform distortion given that the lower kinetic inductance material serves to provide a lower impedance pathway around the high kinetic inductance material.

Figure 4:
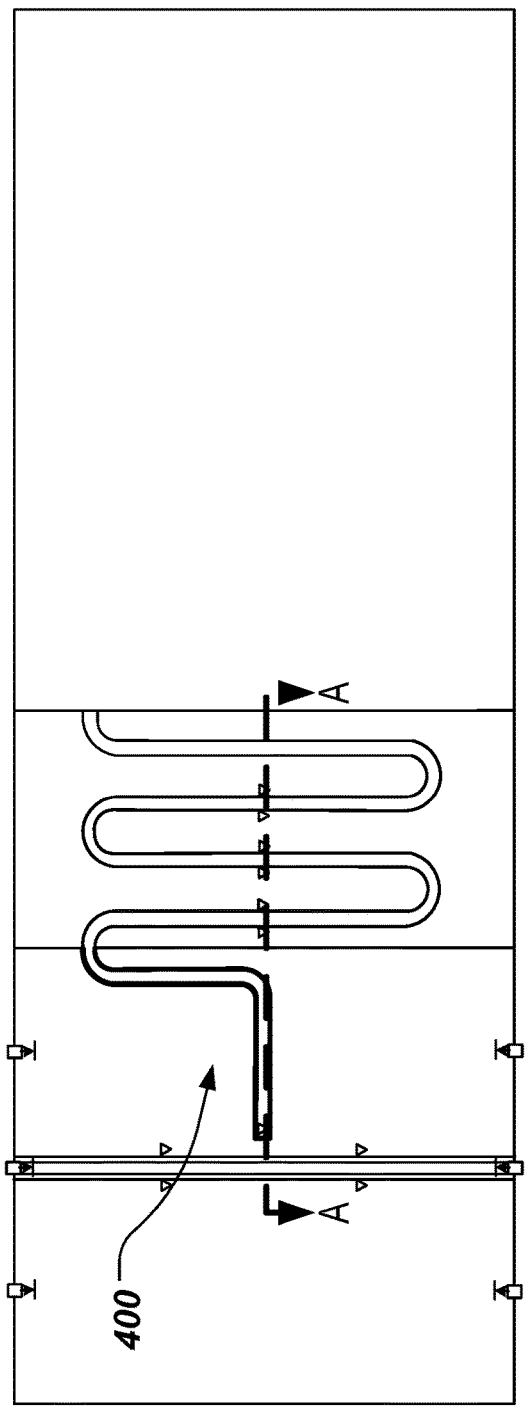
FIG. 4 is a schematic illustrating an example of a circuit element formed from a superconducting material having a high kinetic inductance.
Figure 4:
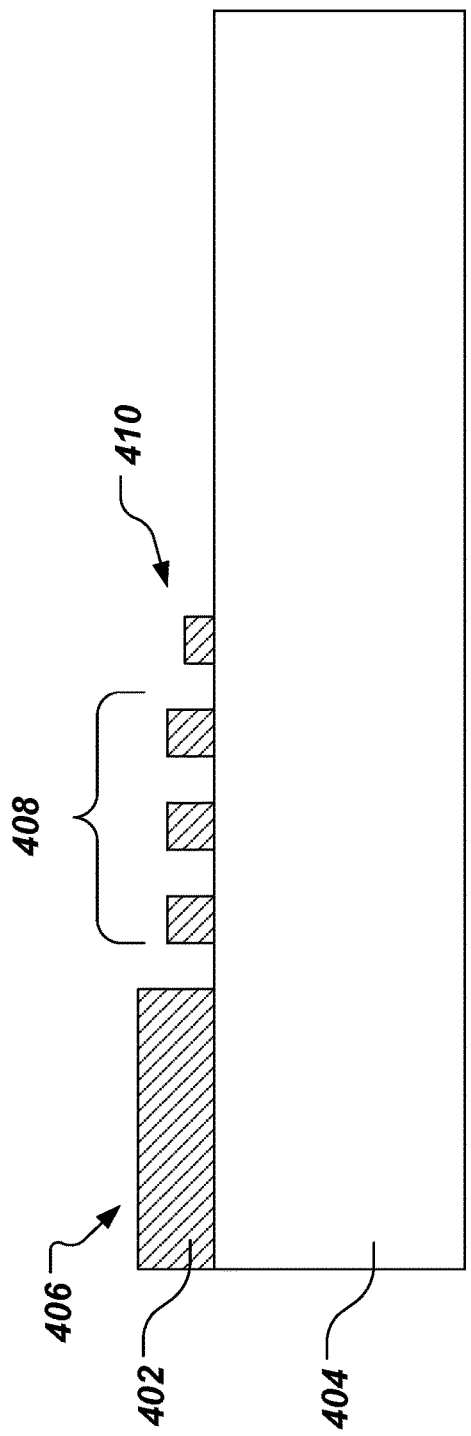

FIG. 4 is a schematic illustrating an example of a circuit element 400 (e.g., a qubit measurement resonator) formed from a superconducting material having a high kinetic inductance, in which the value of kinetic inductance in the circuit element varies in different regions by modifying a geometric dimension (e.g., thickness of the circuit element) of the circuit element in those regions. FIG. 4 shows a plan view of the qubit measurement resonator 400 and a cross-section view through line A-A of the resonator 400. Similar to resonator 200, resonator 400 includes a center conductor laterally separated from a ground plane by a constant gap width. For ease of viewing, the ground plane is omitted from FIG. 4. The resonator 400 is formed entirely of a superconductor material 402 exhibiting a high kinetic inductance in the frequency range of about 500 MHz-20 GHz. For example, in some implementations, the resonator 400 is formed from titanium nitride or niobium nitride.

As shown in the cross-section view of FIG. 4, the thickness of the resonator 400 varies along the length of the central conductor from a first end to a second end. That is, in a first region 406, the thickness of the superconductor material 402 has a first thickness (e.g., 500 nm). In a second region 408, the superconductor material 402 is thinned to have a second thickness (e.g., 100 nm) that is less than the first thickness. In a third region 410, the superconductor material 402 is thinned further to have a third thickness (e.g., 20 nm) that is less than both the first and second thickness. As the thickness of the resonator 400 decreases from region 406 to 410, the kinetic inductance per unit length associated with each region increases. For example, the value of kinetic inductance per unit length in region 406 may be higher than the kinetic inductance per unit length in regions 408 and 410, whereas the value of kinetic inductance per unit length in region 408 may be higher than the kinetic inductance per unit length in region 410. The overall inductance of the resonator 400 then may be determined, in certain implementations, based on the particular kinetic inductance values exhibited in each of regions 406, 408 and 410. Thus, altering a thickness of a superconductor along its length provides another approach for varying the overall inductance of a circuit element, without needing to vary the footprint of the circuit element.

For instance, in some implementations, a system may include multiple quantum information processing devices of the same type (e.g., qubit measurement resonators), each having the same footprint on a substrate (e.g., same length and same width of a central conductor path). Each device also may be formed from a material having a high kinetic inductance at a predetermined frequency (e.g., titanium nitride or niobium nitride under applied electric fields with a frequency between 500 MHz-20 GHz). The overall inductance, and thus the resonant properties (e.g., central frequency), of each of the quantum information processing devices then may be varied by changing the amount of high kinetic inductance material (e.g., by changing the thickness of the high kinetic inductance material) in one or more different regions along the device without altering the footprint of the device on the substrate.

In some implementations, combining materials exhibiting high kinetic inductance with materials exhibiting low kinetic inductance may be used to alter the characteristic impedance of circuit elements, e.g., for performing impedance matching. For example, a strip line will have substantially different impedance from a co-planar waveguide of the same length because of the lower capacitance per unit length of the co-planar waveguide. As a result, when a strip line is connected to a co-planar waveguide having a different impedance, this may result in signal back reflectance. To reduce the back reflectance, the co-planar waveguide and the signal line can be formed to have the same impedance. For example, the inductance L of the signal trace can be increased so that its impedance (which can be expressed as $\sqrt{L/C}$) matches the impedance of the co-planar waveguide. For instance, in some implementations, it may be desirable to set the impedance of the strip line to 50 ohms or 75 ohms so that it matches standard impedance values used with microwave components. For a strip line, this may be accomplished by narrowing the width of the signal line to compensate for the higher capacitance per unit length or moving the ground planes further away from the signal line to reduce the capacitance per unit length. However, such an approach may require forming the signal line so narrow or the ground planes so far away that it the strip line is difficult to fabricate. An alternative technique for modifying the impedance of the strip line is to increase the inductance of the signal trace by forming the signal trace from a superconducting material having a high kinetic inductance. The signal line then may be formed wider and thus easier to fabricate while providing an impedance that can match the impedance of the co-planar waveguide, and/or of other components.

Figure 5:
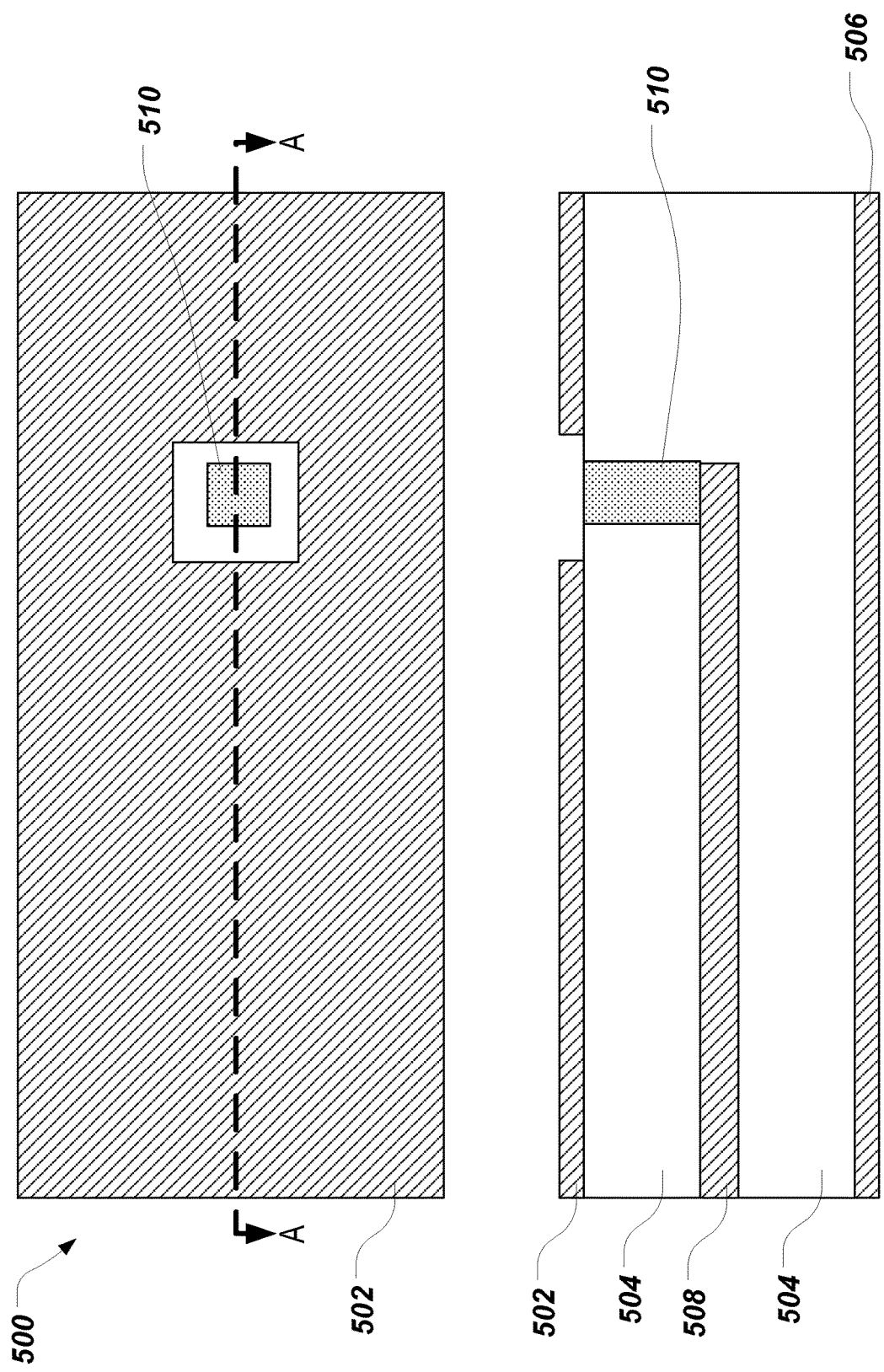
FIG. 5 is a schematic that illustrates a plan view and a cross-section view through line A-A of an example of a strip line design for a superconducting quantum information processing system.

FIG. 5 is a schematic that illustrates a plan view and a cross-section view through line A-A of an example of a strip line design for a superconducting quantum information processing system. For example, the strip line 500 shown in FIG. 5 can be used to carry data and/or control signals to and/or from a qubit, a qubit measurement resonator, or a qubit coupler. The strip line 500 includes a first superconducting layer 500 formed on a first principal surface of a substrate 504 (e.g., the upper surface of substrate 504), a second superconducting layer 506 formed on a second principal surface of substrate 504 (e.g., the lower surface of substrate 504), a superconducting signal trace 508 embedded within the substrate 504, and a superconducting via contact 510 formed within the substrate 504 and connecting to the signal trace 508. Each of the first and second superconducting layers 502, 506 may be formed from a superconducting material having either low or high kinetic inductance. For example, layers 502, 506 may be formed from aluminum, niobium nitride, or titanium nitride. Each of layers 502, 506 serves as a shielding ground plane for signal trace 508. Signal trace 508 is formed from a first superconductor material having a high kinetic inductance, such as titanium nitride, niobium nitride, tungsten silicide, or superconducting aluminum oxide. For example, more than 50% of an overall inductance of the first superconductor material 508 may be attributed to kinetic inductance, or more than 90% of the overall inductance of the first superconductor material 508 may be attributed to kinetic inductance. The width of the strip line (e.g., as defined into and out of the page of the figure) 500 may be in the range, e.g., of between approximately several hundred nanometers to approximately several microns. The thickness of the strip line (e.g., as defined vertically within the page of the figure) 500 may be in the range, e.g., of approximately tens of nanometers to approximately hundreds of nanometers.

The via contact 510 may be filled with a second superconducting material having a low kinetic inductance, such as aluminum. For example, less than 50% of the overall inductance of the second superconductor material may be attributed to kinetic inductance. Though not shown in FIG. 5, the via contact 510 may be connected to a co-planar waveguide or other resonator on the first principal surface of a substrate 504, in which the co-planar waveguide or other resonator is formed from a low kinetic inductance material. Alternatively, the via contact 510 may be coupled to a microwave coupler, such as a circulator, isolator or coupler. In some implementations, the different kinetic inductances of the first and second superconductor material result in the signal trace 508 having a higher inductance per unit length relative to the inductance per unit length of the via contact and the co-planar waveguide, resonator or microwave component to which the via contact 510 is coupled. As a result, the signal line 508 can be designed to have an impedance that matches an impedance of the co-planar waveguide, resonator, or microwave component without having to substantially decrease the width of the signal trace 508.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements and quantum information processing devices) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of 1.2 kelvin), niobium (superconducting critical temperature of 9.3 kelvin), and titanium nitride (superconducting critical temperature of 5.6 kelvin).

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Accordingly, other implementations are within the scope of the following claims.

What is claimed is:

1. A device comprising:
   a substrate;
   a first superconductor layer on the substrate, the first superconductor layer having a first kinetic inductance; and
   a second superconductor layer on the first superconductor layer, the second superconductor layer having a second kinetic inductance that is lower than the first kinetic inductance,
   wherein the second superconductor layer covers the first superconductor layer such that the second superconductor layer and the first superconductor layer have a same footprint, with the exception of at least a first region where the second superconductor layer is omitted so that the first superconductor layer and the second superconductor layer form a circuit element having a predetermined circuit parameter.

2. The device of claim 1, wherein the second superconductor layer provides a lower impedance current path relative to the first superconductor layer.

3. The device of claim 1, wherein more than 50% of an overall inductance of the first superconductor layer is attributed to the first kinetic inductance.

4. The device of claim 3, wherein more than 90% of the overall inductance of the first superconductor layer is attributed to the first kinetic inductance.

5. The device of claim 3, wherein less than 50% of the overall inductance of the second superconductor layer is attributed to the second kinetic inductance.

6. The device of claim 1, wherein the predetermined circuit parameter comprises a resonant frequency of the circuit element.

7. The device of claim 1, wherein the predetermined circuit parameter comprises a center frequency or a cut-off frequency of the circuit element.

8. The device of claim 1, wherein the predetermined circuit parameter is a characteristic impedance of the circuit element.

9. The device of claim 1, wherein the circuit element comprises a qubit measurement resonator.

10. The device of claim 1, wherein the circuit element comprises a co-planar waveguide.

11. The device of claim 1, wherein the circuit element comprises a frequency filter.

12. The device of claim 11, wherein the frequency filter is a bandpass filter.

13. The device of claim 1, wherein the first superconductor layer is titanium nitride.

14. The device of claim 1, wherein the first superconductor layer is niobium nitride.

15. The device of claim 1, wherein the first superconductor layer is a superconductor ceramic.

16. The device of claim 5, wherein the second superconductor layer is aluminum.

17. A system comprising:
   a first superconductor trace comprising having a first predetermined resonator frequency;
   a second superconductor trace having a second predetermined resonator frequency that is different than the first predetermined resonator frequency, wherein each of the first superconductor trace and the second superconductor trace comprises a first layer of a first superconductor material and a second layer of a second superconductor material on the first layer, and wherein a footprint of the first superconductor trace is the same as a footprint of the second superconductor trace.

18. The system of claim 17, wherein the first superconductor material has a first kinetic inductance, and the second superconductor material has a second kinetic inductance that is lower than the first kinetic inductance.

19. The system of claim 18 wherein, for the first superconductor trace, a footprint of the second layer matches a footprint of the first layer with the exception of at least a first region where the second layer is omitted such that the first superconductor trace has the first predetermined resonator frequency.

20. The system of claim 19, wherein, for the second superconductor trace, a footprint of the second layer matches a footprint of the first layer with the exception of at least a second region where the second layer is omitted such that the second superconductor trace has the second predetermined resonator frequency.

21. The system of claim 18 wherein the first superconductor trace is a first qubit measurement resonator, and the second superconductor trace is a second qubit measurement resonator.

22. The system of claim 18, wherein the first superconductor trace is a first frequency filter and the first predetermined resonator frequency is a cut-off or center frequency of the first frequency filter, and
the second superconductor trace is a second frequency filter and the second predetermined resonator frequency is a cut-off or center frequency of the second frequency filter.

23. A superconductor strip line comprising:
a dielectric layer;
a superconductor trace embedded in the dielectric layer, wherein the superconductor trace comprises a first superconductor material having a first kinetic inductance; and
a via contact within the dielectric layer and extending to the superconductor trace,
wherein the via contact comprises a second superconductor material having a second kinetic inductance that is lower than the first kinetic inductance.

24. The superconductor strip line of claim 23, wherein more than 50% of an overall inductance of the first superconductor material is attributed to the first kinetic inductance.

25. The superconductor strip line of claim 24, wherein more than 90% of the overall inductance of the first superconductor material is attributed to the first kinetic inductance.

26. The superconductor strip line of claim 23, wherein less than 50% of the overall inductance of the second superconductor material is attributed to the second kinetic inductance.

27. The superconductor strip line of claim 23, wherein an inductance per unit length of the first superconductor material is higher than an inductance per unit length of the second superconductor material.

28. A device comprising:
a substrate; and
a circuit element comprising a superconductor trace on the substrate, wherein more than 50% of an overall inductance of the superconductor trace is attributed to a kinetic inductance of a superconductor material forming the superconductor trace,
a first region of the superconductor trace has a first cross-sectional area exhibiting a first kinetic inductance, and
a second region of the superconductor trace has a second cross-sectional area exhibiting a second kinetic inductance, the first cross-sectional area being different from the second cross-sectional area such that the first kinetic inductance is different than the second kinetic inductance and such that the circuit element has a predetermined circuit parameter.

29. The device of claim 28, wherein the predetermined circuit parameter comprises a resonant frequency.

30. The device of claim 28, wherein the superconductor material comprises titanium nitride, niobium nitride or a superconductor ceramic.

31. The device of claim 28, wherein the circuit element comprises a qubit measurement resonator.

32. The device of claim 28, wherein the circuit element comprises a frequency filter.

33. The device of claim 28, wherein more than 90% of the overall inductance of the superconductor trace is attributed to the kinetic inductance of the superconductor material.

34. The device of claim 28, wherein the superconductor trace consists of the superconductor material.

* * * * *